United States Patent
Sotozaki et al.

(10) Patent No.: US 10,730,162 B2
(45) Date of Patent: Aug. 4, 2020

(54) TURNTABLE CLOTH PEELING JIG

(71) Applicant: Ebara Corporation, Tokyo (JP)

(72) Inventors: Hiroshi Sotozaki, Tokyo (JP); Kenichiro Saito, Tokyo (JP); Tadakazu Sone, Tokyo (JP)

(73) Assignee: Ebara Corporation, Tokyo (JP)

(*) Notice: Subject to any disclaimer, the term of this patent is extended or adjusted under 35 U.S.C. 154(b) by 321 days.

(21) Appl. No.: 15/638,501

(22) Filed: Jun. 30, 2017

(65) Prior Publication Data
US 2018/0009081 A1   Jan. 11, 2018

(30) Foreign Application Priority Data

Jul. 8, 2016 (JP) ................... 2016-135832
Jul. 8, 2016 (JP) ................... 2016-135947

(51) Int. Cl.
*B32B 43/00* (2006.01)
*B24B 37/30* (2012.01)
*H01L 21/304* (2006.01)
*H01L 21/02* (2006.01)

(52) U.S. Cl.
CPC ........ *B24B 37/30* (2013.01); *H01L 21/02087* (2013.01); *H01L 21/304* (2013.01); *H01L 21/02024* (2013.01); *Y10T 156/1168* (2015.01); *Y10T 156/1174* (2015.01); *Y10T 156/195* (2015.01); *Y10T 156/1978* (2015.01)

(58) Field of Classification Search
CPC ......... Y10T 156/1168; Y10T 156/1174; Y10T 156/195; Y10T 156/1978; B32B 43/006; B24B 37/34; A47G 27/0493
See application file for complete search history.

(56) References Cited

U.S. PATENT DOCUMENTS 126,818 A * 5/1872 Lindsay ............. A47G 27/0493
                                               294/8.6
127,303 A * 5/1872 Bullard ............. A47G 27/0493
                                               254/211
138,333 A * 4/1873 Kelly ................. A47G 27/0493
                                               294/8.6

(Continued)

FOREIGN PATENT DOCUMENTS

JP    10-217148 A    8/1998
JP    10-217149 A    8/1998

(Continued)

*Primary Examiner* — Mark A Osele
(74) *Attorney, Agent, or Firm* — Abelman, Frayne & Schwab (57) ABSTRACT

Disclosed is a turntable cloth peeling jig including: a cylindrical winding cylinder including a slit formed on an outer periphery of the cylindrical winding cylinder and extending in an axial direction thereof; a cloth clamping member disposed inside the winding cylinder and configured to clamp an outer peripheral edge of a cloth inserted into the slit; an extension bar attached to one end portion of the winding cylinder so as to extend coaxially therewith; an engaging portion provided at a tip end portion of the extension bar and engaged with a rotation jig configured to rotate the winding cylinder; and a handle provided in the engaging portion and configured to support the winding cylinder when rotating the rotating jig.

10 Claims, 11 Drawing Sheets

(56) References Cited

U.S. PATENT DOCUMENTS

| | | | | |
|---|---|---|---|---|
| 549,341 | A | * | 11/1895 | Veigel ................. A47G 27/0493 294/8.6 |
| 812,405 | A | * | 2/1906 | Carothers ........... A47G 27/0493 254/211 |
| 5,387,308 | A | * | 2/1995 | Heavrin .............. A47G 27/0487 156/759 |
| 5,878,973 | A | * | 3/1999 | Mizukoshi .............. B24B 37/20 708/711 |
| 5,891,297 | A | * | 4/1999 | Stadtmueller ....... B29C 63/0013 156/715 |
| 6,221,199 | B1 | * | 4/2001 | Chang ..................... B24B 37/20 156/715 |
| 2006/0090847 | A1 | * | 5/2006 | Peirce ................. B29C 63/0013 156/709 |
| 2008/0185100 | A1 | * | 8/2008 | Jang ...................... B32B 43/006 156/714 |

FOREIGN PATENT DOCUMENTS

| | | |
|---|---|---|
| JP | 2006-212764 A | 8/2006 |
| JP | 2007-075949 A | 3/2007 |

\* cited by examiner

TURNTABLE CLOTH PEELING JIG

CROSS-REFERENCE TO RELATED APPLICATIONS

This application is based on and claims priority from Japanese Patent Application Nos. 2016-135832 and 2016-135947 filed on Jul. 8, 2016 with the Japan Patent Office, the disclosures of which are incorporated herein in their entirety by reference.

Technical Field

The present disclosure relates to a turntable cloth peeling jig used for peeling a cloth adhered to a turntable.

Background

In a semiconductor wafer manufacturing process, a polishing apparatus is used to flatten and mirror-finish a surface of a semiconductor wafer. This type of polishing apparatus has a turntable and a top ring which rotate at independent rotational speeds. In the polishing apparatus, the surface of a semiconductor wafer held on the top ring is brought into contact with the surface (polished surface) of a cloth attached to the turntable and polished while an abrasive liquid is supplied.

Meanwhile, the cloth on the turntable is firmly attached to the turntable so as not to be peeled from the turntable when the semiconductor wafer is polished. For this reason, when the cloth wears and needs to be replaced with a new cloth, a strong force is required to peel off the cloth.

Japanese Patent Laid-Open Publication Nos. 10-217148 and 10-217149 disclose a conventional turntable cloth peeling jig. In this peeling jig, a winding cylinder is rotated using a ratchet handle.

Meanwhile, Japanese Patent Laid-Open Publication No. 2007-075949 proposes a turntable capable of relatively easily peeling off a cloth without requiring a strong force to peel off the cloth from the turntable.

SUMMARY

According to the present disclosure, there is provided a turntable cloth peeling jig including: a cylindrical winding cylinder including a slit formed on an outer periphery of the cylindrical winding cylinder and extending in an axial direction thereof; a cloth clamping member disposed inside the winding cylinder and configured to clamp an outer peripheral edge of a cloth inserted into the slit; an extension bar attached to one end portion of the winding cylinder so as to extend coaxially therewith; an engaging portion provided at a tip end portion of the extension bar and engaged with a rotation jig configured to rotate the winding cylinder; and a handle provided in the engaging portion and configured to support the winding cylinder when rotating the rotating jig.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the conventional peeling jig disclosed in Japanese Patent Laid-Open Publication Nos. 10-217148 and 10-217149, since the ratchet handle is directly engaged with one end portion of the winding cylinder at least at the start of winding the cloth, the ratchet handle is placed in the polishing room. Since a large number of peripheral devices (e.g., a dresser, an atomizer, a top ring, and an abrasive liquid nozzle) are provided in the polishing room in advance, the ratchet handle may interfere with the peripheral devices when the ratchet handle is swung.

Therefore, in the conventional peeling jig, when the cloth is peeled off until the time just before the ratchet handle interferes with the peripheral devices, the turntable is rotated to a position where the ratchet handle does not interfere with the peripheral devices, and the turntable cloth is peeled off until the time just before the ratchet handle interferes with the peripheral devices. This work needs to be repeated many times. Thus, the work is complicated.

Further, in order to support the winding cylinder so as not to be swung or tilted when swinging the ratchet handle, there is no other way than pressing an adhesive surface of the turntable cloth wound around the winding cylinder with the hand opposite to the hand holding the ratchet handle, and the glove put on the hand sticks to the adhesive surface. Thus, it is hard to work.

Instead of using the conventional peeling jig, a worker may grasp the outer edge of the cloth with pincers or pliers to pull it. However, since the worker pulls the outer edge of the cloth while grasping the handle of the pincers or pliers, it is difficult for the worker to apply a force and grasp the cloth securely. Thus, the work may become unsafe.

Further, in the turntable disclosed in Japanese Patent Laid-Open Publication No 2007-075949, which is capable of relatively easily peeling off the cloth without requiring a strong force to peel off the cloth from the turntable, a peeling jig with a complicated structure using a ratchet handle is not required because the adhesive force of the cloth is relatively weak.

The present disclosure has been made in consideration of the above circumstance. The present disclosure is to provide a turntable cloth peeling jig capable of easily peeling off a cloth from a turntable and has a simple structure.

According to the present disclosure, there is provided a turntable cloth peeling jig including: a cylindrical winding cylinder including a slit formed on an outer periphery of the cylindrical winding cylinder and extending in an axial direction thereof; a cloth clamping member disposed inside the winding cylinder and configured to clamp an outer peripheral edge of a cloth inserted into the slit; an extension bar attached to one end portion of the winding cylinder so as to extend coaxially therewith; an engaging portion provided at a tip end portion of the extension bar and engaged with a rotation jig configured to rotate the winding cylinder; and a handle provided in the engaging portion and configured to support the winding cylinder when rotating the rotating jig.

According to the present disclosure, since the handle is held by the hand opposite to the hand holding the rotating jig when the rotating jig is rotated, it is possible to keep the attitude and position of the winding cylinder constant without touching the adhesion surface of the cloth wound on the winding cylinder. As a result, the cloth may be easily peeled off from the turntable without swinging or tilting the winding cylinder under the influence of rotation of the rotating jig. In addition, since the rotating jig and the handle are attached to the tip end portion of the extension bar, it is possible to cause them to protrude to the outside of the polishing room when the rotation jig is rotated. In this case, the rotating jig may be rotated without interfering with the peripheral devices in the polishing room such that the cloth can be continuously peeled off, which eliminates the need of the work of rotating the turntable so many times in the middle of peeling off the cloth.

In the turntable cloth peeling jig according to the present disclosure, the engaging portion may be a gear wrench that reduces a rotational torque of the rotating jig.

According to this aspect, the force required to rotate the rotating jig is reduced. Thus, the cloth may be more easily and reliably peeled off from the turntable.

In the turntable cloth peeling jig according to the present disclosure, the cloth clamping member may include an upper member and a lower member that clamp the outer peripheral edge of the cloth from an upper side and a lower side thereof, and the upper and lower members may mutually engageable teeth may be provided on mutually facing surfaces thereof.

According to this aspect, the cloth is clamped between the teeth of the upper member and the teeth of the lower member so that the cloth is firmly fixed to the cloth clamping member. Therefore, the cloth may be suppressed from falling out of the cloth clamping member during the rotation of the winding cylinder.

In the turntable cloth peeling jig according to the present disclosure, the cloth clamping member may include an upper member and a lower member that clamp the outer peripheral edge of the cloth from an upper side and a lower side thereof, and one of the upper and lower members may include a pin configured to break through the cloth when the outer peripheral edge of the cloth is clamped, and a remaining one of the upper and lower members may include a pin insertion hole into which the pin is inserted.

According to this aspect, the pin breaks through the cloth so that the cloth is firmly fixed to the cross clamping member. Therefore, the cloth may be suppressed from falling out of the cloth clamping member during the rotation of the winding cylinder.

In the turntable cloth peeling jig according to the present disclosure, an axial length of the extension bar may be longer than an axial length of the winding cylinder.

According to the present disclosure, there is provided a turntable cloth peeling jig including: a cloth clamping member configured to clamp an outer peripheral edge of a cloth; and a handle configured to pull the cloth clamping member. The cloth clamping member includes an upper member and a lower member that clamp the outer peripheral edge of the cloth from an upper side and a lower side thereof. The upper and lower members include mutually engageable teeth provided on mutually facing surfaces thereof. The teeth are provided is over 5 cm or more in the longitudinal direction of the upper and lower members.

According to the present disclosure, since the cloth is clamped between the teeth of the upper member and the teeth of the lower member, which are formed in a length of 5 cm or more, the cloth is firmly fixed to the cloth clamping member. As a result, when the handle is gripped and pulled, the cloth may be suppressed from falling out from the cloth clamping member. Thus, the cloth may be easily peeled off from the turntable. Further, the present disclosure does not adopt a complicated structure such as a ratchet structure but a simple structure. Therefore, the manufacturing cost may be greatly reduced compared with the conventional peeling jig.

In the turntable cloth peeling jig according to the present disclosure, one of the upper and lower members may include a pin configured to break through the cloth when the outer peripheral edge of the cloth is clamped, and a remaining one of the upper and lower members may include a pin insertion hole into which the pin is inserted.

According to this aspect, the pin of the cloth clamping member breaks through the cloth so that the cloth is firmly fixed to the cross clamping member. Therefore, when the handle is grasped and pulled, the cloth may be suppressed from falling out of the cloth clamping member.

In the turntable cloth peeling jig according to the present disclosure, at least a part of the upper member and the lower member may be covered with a cover made of a soft member.

According to this aspect, even though the cloth clamping member is inadvertently brought into contact with the upper surface of the turntable when grasping and pulling the handle, impact is absorbed by the cover. Thus, damage to the turntable may be reduced.

The turntable cloth peeling jig according to the present disclosure further includes an extension bar configured to connect the cloth clamping member and the handle, in which one end of the extension bar is rotatably attached to a longitudinal end portion of the cloth clamping member, and another end of the extension bar is rotatably attached to a longitudinal end portion of the handle.

According to this aspect, when grasping and pulling the handle, both end portions of the extension bar are rotated in accordance with the direction of the pulling force. Thus, the handle may be positioned at a position where the handle is easily held. As a result, a force may be effectively applied to the handle. Therefore, the cloth may be more easily peeled off from the turntable.

In the turntable cloth peeling jig according to the present disclosure, the handle may have a U-shape and be directly fixed to the cloth clamping member.

According to this aspect, the structure is extremely simple, and the manufacturing cost of the peeling jig may be further reduced.

According to the present disclosure, it is possible to provide a turntable cloth peeling jig which can easily peel off a cloth from a turntable and has a simple structure.

Hereinafter, exemplary embodiments of the present disclosure will be described in detail with reference to the accompanying drawings. In the drawings attached hereto, for the convenience of illustration and easy understanding of the drawings, the scales and the aspect ratios in the vertical and horizontal directions are appropriately changed from those of the actual ones by exaggeration.

Figure 1:
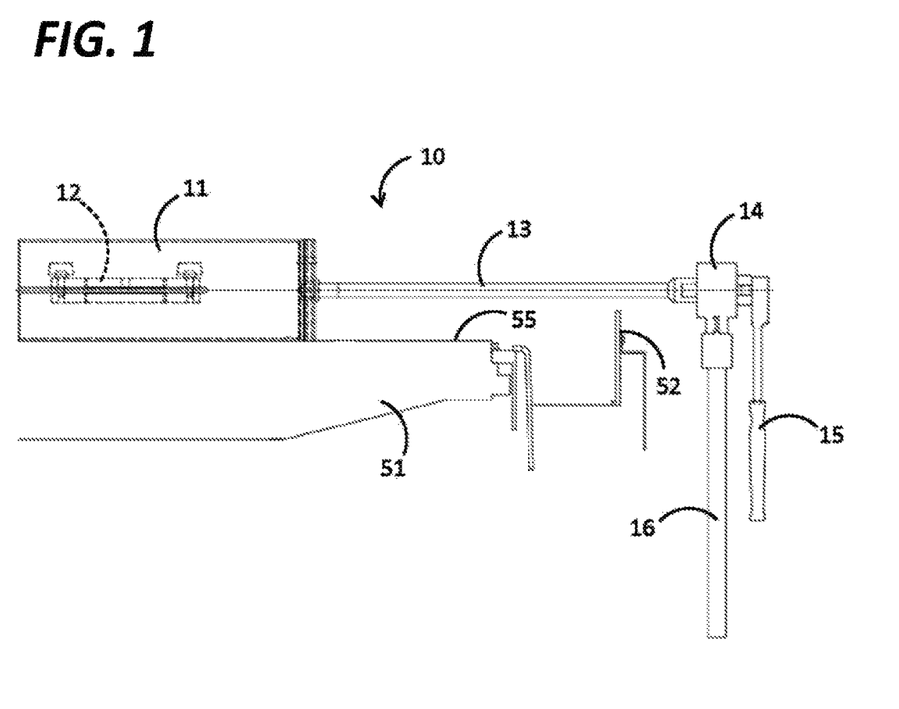
FIG. 1 is a schematic view illustrating a state where a peeling jig according to an exemplary embodiment is disposed on a turntable.
Figure 2:
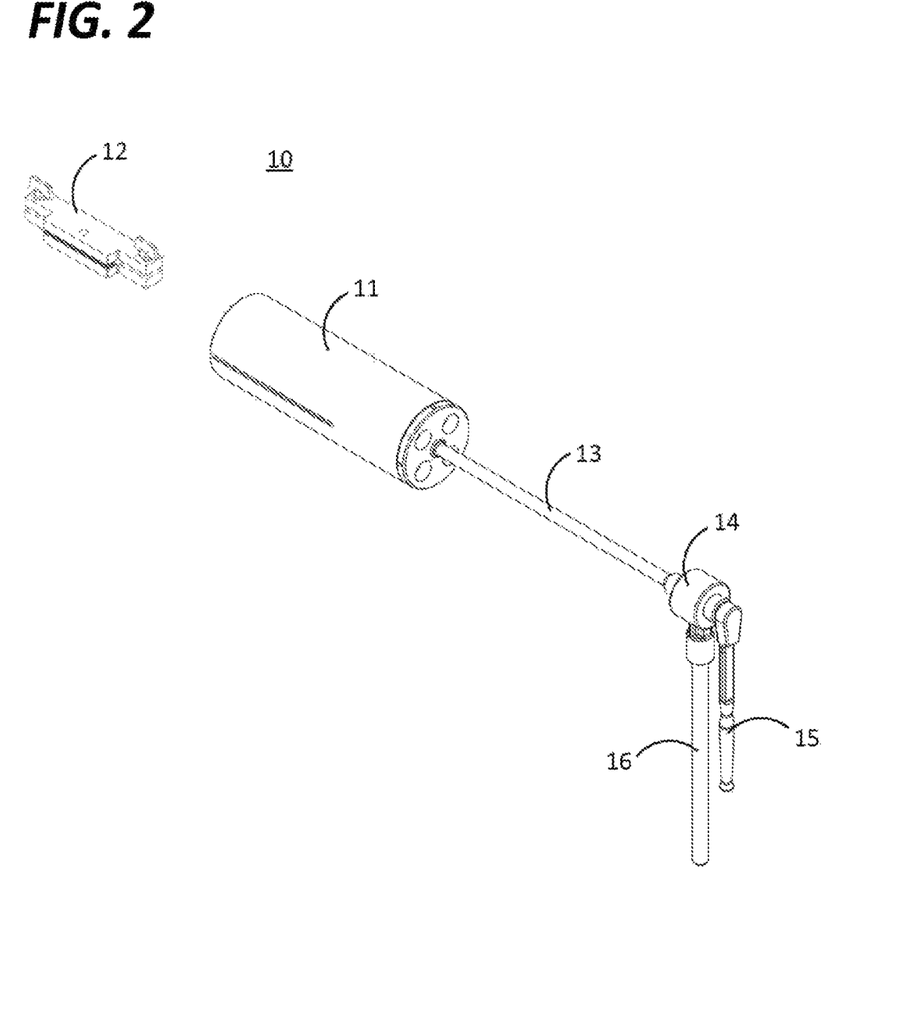
FIG. 2 is an exploded perspective view illustrating the peeling jig illustrated in FIG. 1.

FIG. 1 is a schematic view illustrating a state where a peeling jig according to an exemplary embodiment is disposed on a turntable. FIG. 2 is an exploded perspective view of the peeling jig illustrated in FIG. 1.

As illustrated in FIGS. 1 and 2, a peeling jig 10 includes a winding cylinder 11 having a cylindrical shape, a cloth clamping member 12 disposed inside the winding cylinder 11, an extension bar 13 attached to one end of the winding cylinder 11, an engaging portion 14 provided at a tip end portion of the extension bar 13, a rotating jig 15 engaged with the engaging portion 14, and a handle 16. Hereinafter, respective parts will be described.

Figure 3:
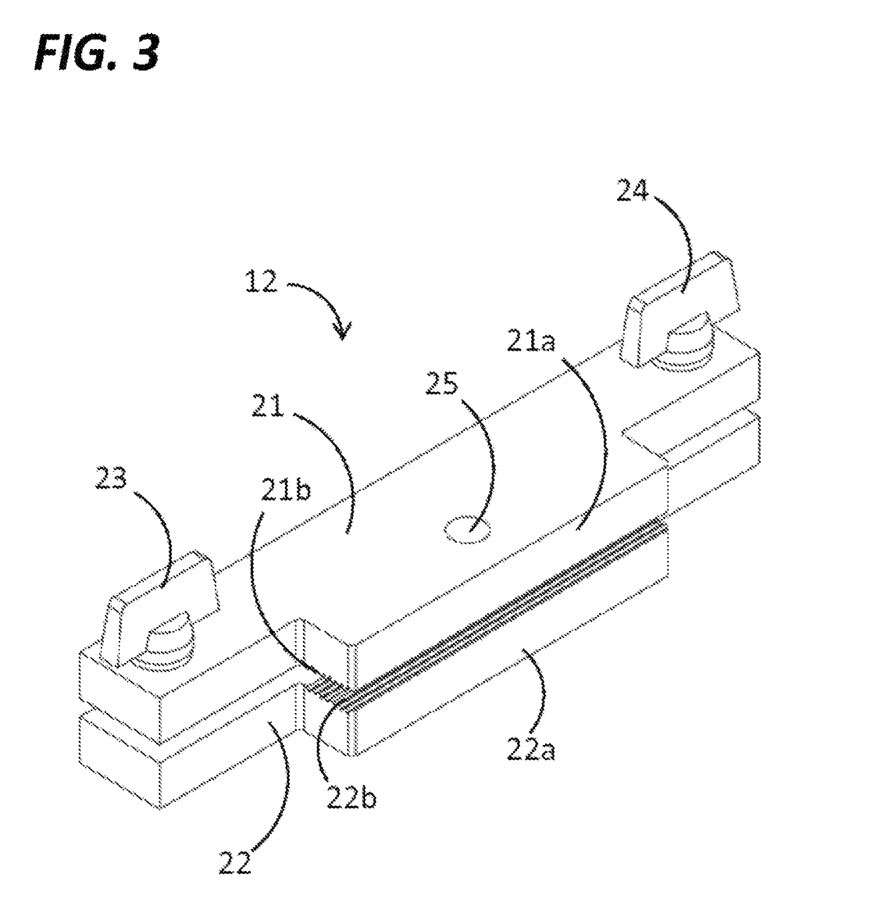
FIG. 3 is an enlarged perspective view illustrating a cloth clamping member of the peeling jig illustrated in FIG. 2.
Figure 4:
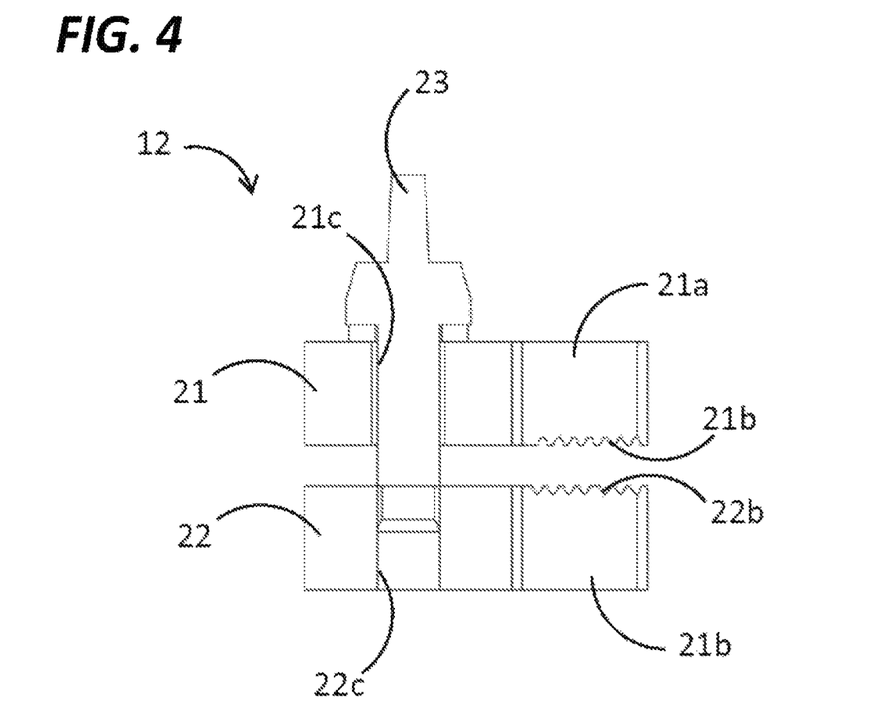
FIG. 4 is a vertical-sectional view illustrating the cloth clamping member illustrated in FIG. 3.

FIG. 3 is an enlarged perspective view illustrating the cloth clamping member 12. FIG. 4 is a vertical-sectional view of the cloth clamping member 12.

As illustrated in FIGS. 3 and 4, the cloth clamping member 12 includes an upper member 21 and a lower member 22, and two fixing screws 23, 24 that fix the upper member 21 and the lower member 22.

Among them, the upper member 21 is made of a metal and has an elongated flat plate shape, and through-holes 21c through which the fixing screws 23, 24 are inserted are formed in the vicinity of both longitudinal ends thereof. Further, a clamping portion 21a protruding in a tongue piece shape is provided in the central portion of one side of the upper member 21. On the lower surface of the clamping portion 21a, teeth 21b are formed by a large number of parallel peaks and valleys. Further, a vertically penetrating confirmation hole 25 is formed in the central portion of the upper surface of the clamping portion 21a.

Meanwhile, the lower member 22 is made of a metal and has an elongated flat plate shape, and screwing holes 22c is formed in the vicinity of both longitudinal ends thereof to be screwed with the fixing screws 23, 24. Further, a clamping portion 22a protruding in a tongue piece shape is provided in the central portion of one side of the lower member 22. On the upper surface of the clamping portion 22a, teeth 22b are formed by a large number of parallel peak and valleys.

The teeth 22b of the upper member 21 and the teeth 22b of the lower member 22 are engageable with each other.

In the illustrated example, the fixing screws 23, 24 are formed in a so-called thumb screw type such that their heads are pivotable directly with fingers.

Figure 5:
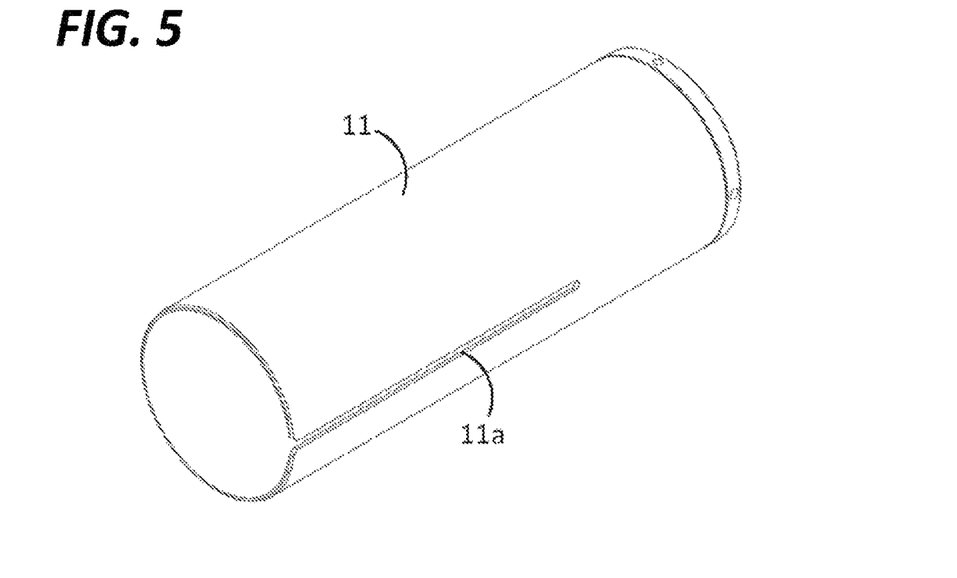
FIG. 5 is an enlarged perspective view illustrating a winding cylinder of the peeling jig illustrated in FIG. 2.
Figure 6:
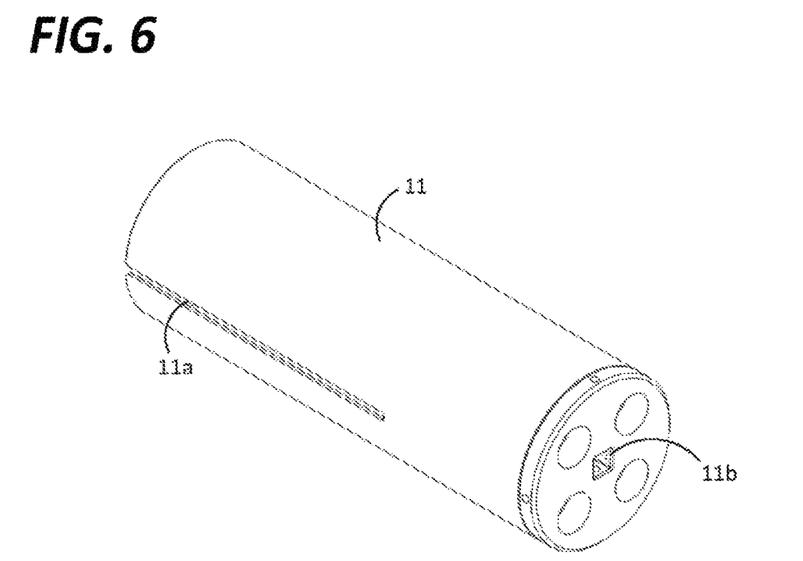
FIG. 6 is a perspective view illustrating the winding cylinder illustrated in FIG. 5 when viewed at a different angle.
Figure 7:
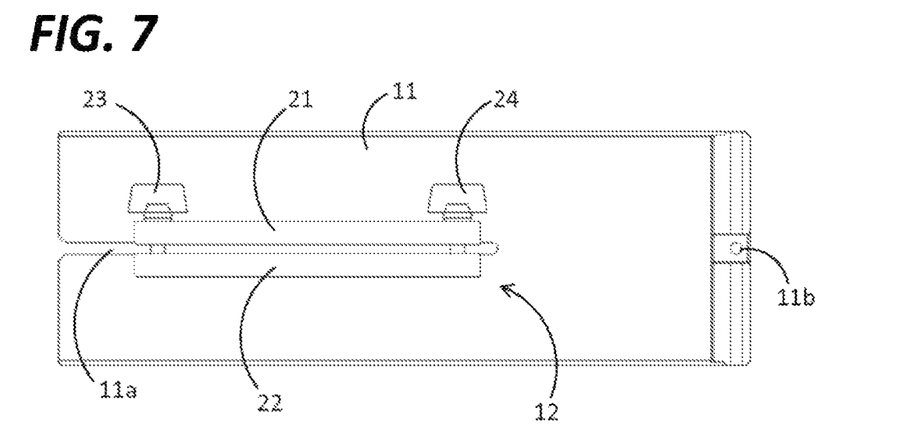
FIG. 7 is an internal front view illustrating a state where the cloth clamping member is disposed inside the winding cylinder.
Figure 8:
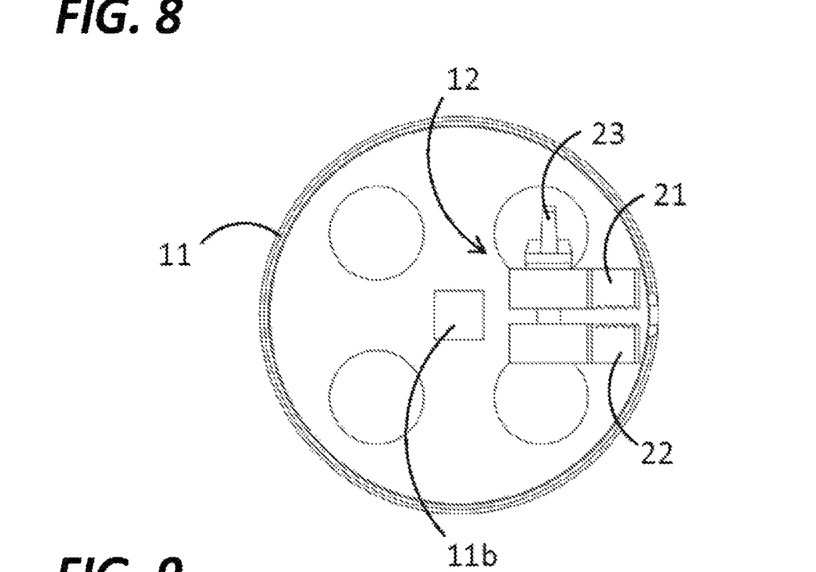
FIG. 8 is an internal side view illustrating a state where the cloth clamping member is disposed inside the winding cylinder.

FIG. 5 is an enlarged perspective view illustrating the winding cylinder 11. FIG. 6 is a perspective view of the winding cylinder 11 when viewed at a different angle. FIG. 7 is an internal front view illustrating a state where the cloth clamping member 12 is disposed inside the winding cylinder 11. FIG. 8 is an internal side view illustrating a state where the cloth clamping member 12 is disposed inside the winding cylinder 11.

As illustrated in FIGS. 5 to 8, the winding cylinder 11 is made of a metal and has a cylindrical shape, and an inner cavity thereof has an inner diameter capable of accommodating the cloth clamping member 12.

One long slit 11a is formed on the outer periphery of the winding cylinder 11 to extend along the axial direction of the cylinder. A rectangular hole-shaped extension bar mounting portion 11b is provided in the central portion of one end surface of the winding cylinder 11.

As illustrated in FIGS. 1 and 2, the extension bar 13 is made of a metal, has a rod shape, and is mounted to extend coaxially with the extension bar mounting portion 11b of the winding cylinder 11. In the illustrated example, the length of the extension bar 13 is longer than the longitudinal length of the winding cylinder 11 such that when the winding cylinder 11 is positioned at the center of the turntable 51, the tip end of the extension bar 13 protrudes to the outside of the polishing room 52 (see, e.g., FIG. 1).

The engaging portion 14 is provided at a tip end portion of the extension bar 13 to be engaged with a rotating jig 15 that rotates the winding cylinder 11.

In the exemplary embodiment, a gear wrench with a planetary gear mechanism (also called a power wrench or a boost wrench) is used as the engaging portion 14. Thus, the rotational torque of the rotating jig 15 may reduced. The gear reduction ratio is, for example, 4.

Specifically, for example, a ratchet handle is used as the rotating jig 15. Hereinafter, the "ratchet handle" may be described with reference numeral 15.

As illustrated in FIGS. 1 and 2, the engaging portion 14 is provided with a handle 16 to hold the winding cylinder 11 when the ratchet handle 15 is swung.

Next, descriptions will be made on a method of using the peeling jig 10 having such a configuration.

Figure 9:
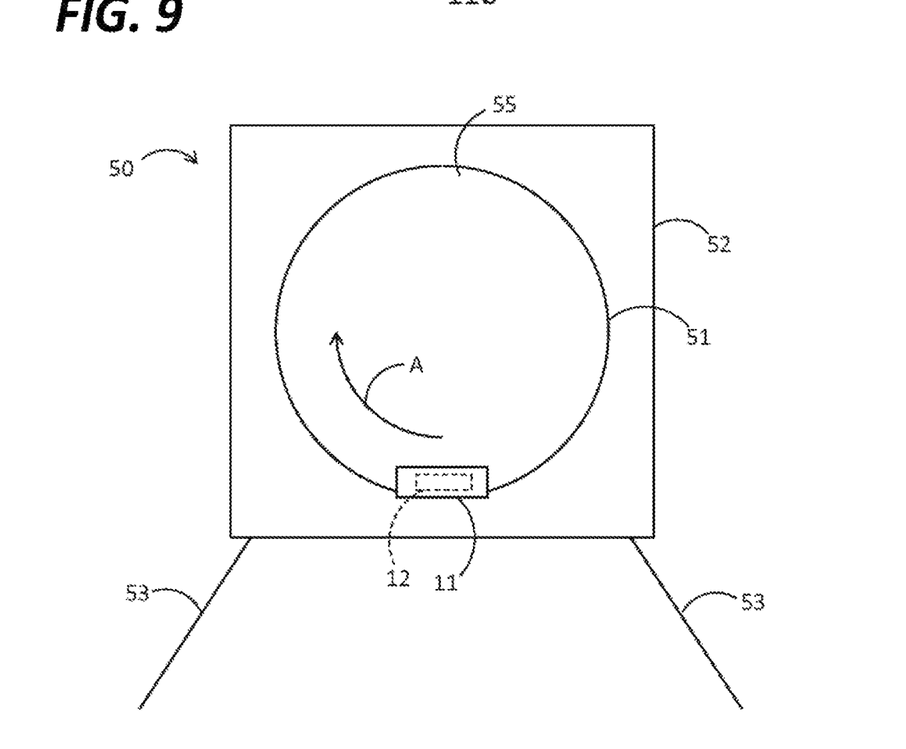
FIG. 9 is a schematic view for explaining a method of using the peeling jig illustrated in FIG. 1.

First, as illustrated in FIG. 9, a door 53 of a polishing room 52 of a polishing apparatus 50 is opened, and a part of the outer peripheral edge of a disk-shaped cloth 55 attached to the upper surface of a turntable 51 is slightly peeled off. Then, the peeled portion of the cloth 55 is clamped between the teeth 21b of the upper member 21 of the cloth clamping member 12 and the teeth 22b of the lower member 22 (see, e.g., FIGS. 3 and 4).

Next, the fixing screws 23, 24 are inserted into the through-holes 21c of the upper member 21 and screwed into the screw holes 22c of the lower member 22, so that the cloth 55 is firmly clamped between the teeth 21b of the upper member 21 and the teeth 22b of the lower member 22. At this time, both the clamping portion 21a of the upper member 21 and the clamping portion 22a of the lower member 22 protrude from the attaching positions of the fixing screws 23, 24 toward the cloth 55. Therefore, even when the length of the cloth clamping member 12 becomes short, there is no case in which the cloth 55 abuts on the fixing screws 23, 24 to cause the cloth 55 so as not to be sufficiently inserted between the clamping portion 21a of the upper member 21 and the clamping portion 22a of the lower member 22. Thus, the clamping may be securely performed.

Further, as illustrated in FIG. 3, since the clamped cloth 55 is able to be visually confirmed from the confirmation hole 25 formed in the upper member 21, it is possible to immediately determine to what extent the cloth 55 is inserted in the cloth clamping member 12.

Next, the cloth clamping member 12 clamping the cloth 55 therebetween is inserted into the winding cylinder 11. At this time, the cloth 55 is inserted into the slit 11a of the winding cylinder 11.

As described above, the operation in which the outer peripheral edge of the cloth 55 is fixed to the cloth clamping member 12 and the cloth clamping member 12 is further set in the winding cylinder 11, may be performed on the cloth on the front side of an operator as illustrated in FIG. 9. Alternatively, the operation may be performed on a cloth on the other side of the operator (although illustration is omitted). As illustrated in FIG. 9, the workability is better when the operation is performed on the cloth on the front side of the operator.

Figure 10:
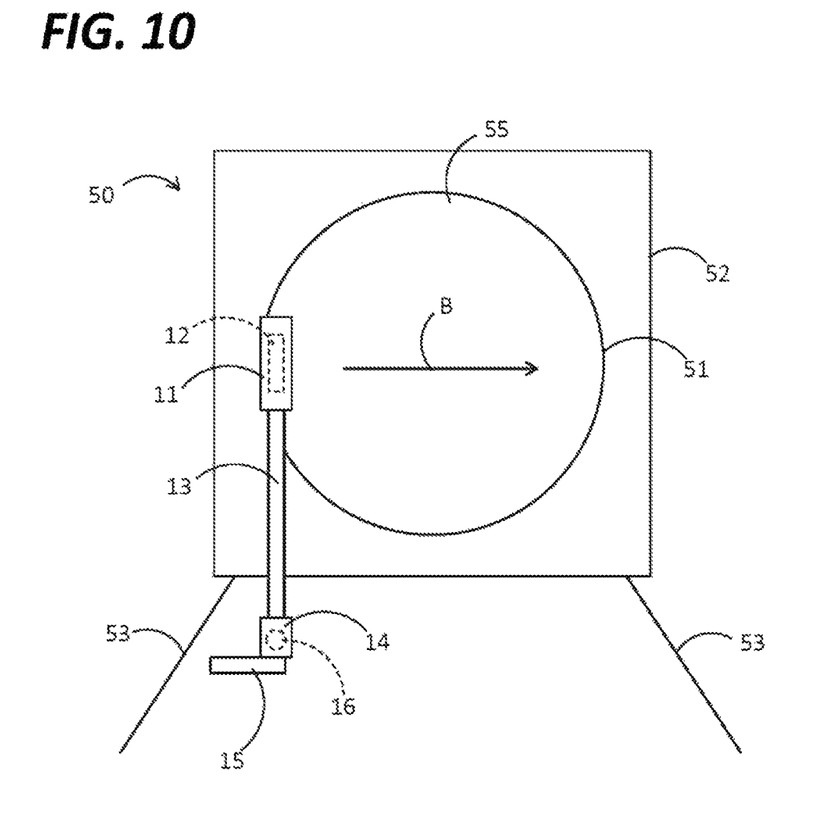
FIG. 10 is a schematic view for explaining a method of using the peeling jig illustrated in FIG. 1.

Next, the turntable 51 is rotated in the direction of the arrow A in FIG. 9, and one end portion of the winding cylinder 11 at the extension bar mounting portion 11b side is directed toward the opened door 53. Then, as illustrated in FIG. 10, the extension bar 13 is inserted into the polishing room 52 and attached to the extension bar mounting portion 11b of the winding cylinder 11. At this time, the engaging portion 14 of the tip end portion of the extension bar 13 protrudes to the outside of the polishing room 52, and the handle 16 and the ratchet handle 15 attached to the engaging portion 14 are positioned outside the polishing room 52.

Next, when the ratchet handle 15 is swung with one hand while the handle 16 is supported by the other hand, the winding cylinder 11 is rotated in one direction (the direction of the arrow B in FIG. 10) so that the cloth 55 is wound around the outer periphery of the winding cylinder 11. This work may be performed easily and reliably even with a weak force by the lever principle.

As described above, however, in the conventional peeling jig, since the ratchet handle is directly engaged with one end portion of the winding cylinder at least at the start of winding the cloth, the ratchet handle may interfere with the peripheral devices when the ratchet handle is swung. Therefore, in the conventional peeling jig, when the cloth is peeled off until the time just before the ratchet handle interferes with the peripheral devices, the turntable is rotated to a position where the ratchet handle does not interfere with the peripheral devices, and the turntable cloth is peeled off until the time just before the ratchet handle interferes with the peripheral devices. This work needs to be repeated many times. Thus, the work is complicated.

Further, in the conventional peeling jig, in order to support the winding cylinder so as not to be swung or tilted when swinging the ratchet handle, there is no other way than pressing an adhesive surface of the turntable cloth wound around the winding cylinder with the hand opposite to the hand holding the ratchet handle, and the glove fitted in the hand sticks to the adhesive surface. Thus, it is hard to work.

Meanwhile, according to the present disclosure, since the handle 16 is held by the hand opposite to the hand holding the ratchet handle 15 when the handle 16 is rotated, it is possible to keep the attitude and position of the winding cylinder 11 constant without touching the adhesion surface of the cloth 55 wound on the winding cylinder 11. As a result, the cloth 55 may be easily peeled off from the turntable 51 without swinging or tilting the winding cylinder 11 under the influence of the swing of the ratchet handle 15.

Further, according to the present exemplary embodiment, since the ratchet handle 15 and the handle 16 are provided at the tip end portion of the extension bar 13, it is possible to cause them to protrude outside the polishing room 52 when the ratchet handle 15 is swung. In this case, the ratchet handle 15 may be swung without interfering with the peripheral devices in the polishing room so that the cloth 55 can be continuously peeled off, which eliminates the need of the work of rotating the turntable 51 so many times in the middle of peeling off the cloth.

Further, according to the present embodiment, since the engaging portion 14 is a gear wrench that reduces the rotational torque of the ratchet handle 15, the force required to rotate the ratchet handle 15 is reduced. Therefore, the cloth 55 may be peeled off more easily and reliably.

According to the exemplary embodiment, the cloth 55 is clamped between the teeth 21b of the upper member 21 of the cloth clamping member 12 and the teeth 22b of the lower member 22 so that the cloth 55 is firmly fixed to the cloth clamping member 12. Therefore, the cloth 55 may be suppressed from falling out of the cloth clamping member 12 during the rotation of the winding cylinder 11.

Although the exemplary embodiment of the present disclosure has been described in detail above, the present disclosure is not limited to this exemplary embodiment. For example, the following modifications are possible.

In the above-described exemplary embodiment, the teeth 21b, 22b each formed of peak and valleys are provided in the clamping portions 21a, 22a of the upper member 21 and the lower member 22, respectively. Instead, however, one may be provided with a pin that breaks through the cloth 55 when clamping the outer edge of the cloth 55, and the other one may be provided with a pin insertion hole into which the pin is inserted. Further, a clamping surface of another structure (for example, adhering a member having a friction surface) may be used, and in some cases, it is not necessary to provide any teeth 21b, 22b, which are formed of peaks and valleys, or pins.

Further, in the above-described exemplary embodiment, the cloth clamping member 12 and the winding cylinder 11 are separate members, but they may be integrated. That is, for example, two adjacent tongue pieces may protrude from the inner peripheral surface of the winding cylinder such that the end of the cloth inserted through the slit is clamped by the tongue pieces, and then the tongue pieces may be pressed against each other by, for example, screws.

Further, in the above-described exemplary embodiment, the cloth clamping member 12 and the winding cylinder 11 are made of a metal, but they may be made of a material other than the metal.

Further, in the above-described exemplary embodiment, thumb screws are used as the fixing screws 23, 24, but screws having another shape structure may be of course used. Further, those fixing the upper member 21 and the lower member 22 are not necessarily the fixing screws 23, 24, but other fixing means (e.g., bolts and nuts) may be used. Further, when one ends of the upper member 21 and the lower member 22 are formed in a hinge structure, only one fixing screw 23 or 24 may be attached to the opposite side of the hinge structure.

Further, in the above-described exemplary embodiment, a ratchet handle is used as a rotating jig for rotating the winding cylinder 11, but a rotating jig having another shape (e.g., a circular handle) may be used.

Further, in the above-described exemplary embodiment, the peeling jig 10 is used for peeling off the turntable cloth 55, but it may be used for peeling off a vinyl floor material or a wallpaper.

Figure 11:
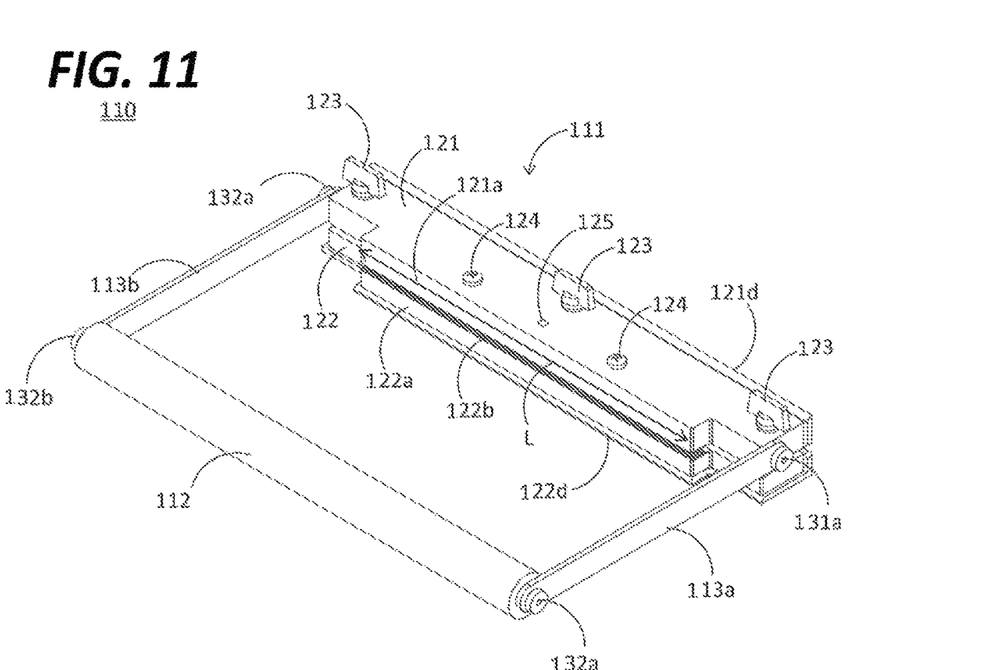
FIG. 11 is a perspective view illustrating a peeling jig according to another exemplary embodiment.
Figure 12:
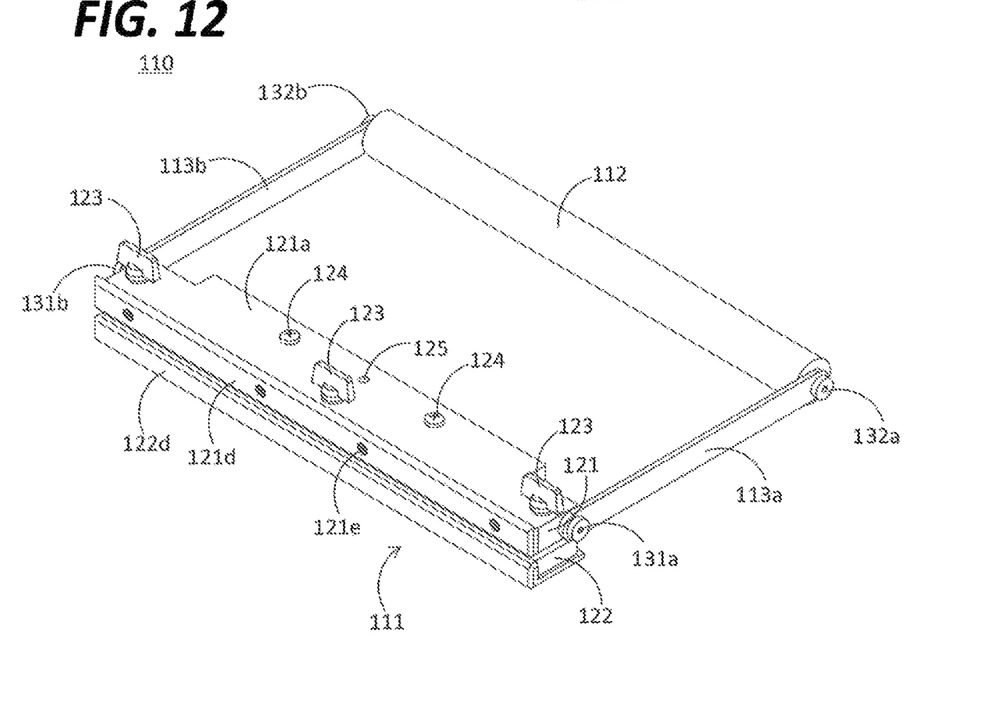
FIG. 12 is a perspective view illustrating the peeling jig illustrated in FIG. 11 when viewed at a different angle.

FIG. 11 is a perspective view illustrating a peeling jig according to another exemplary embodiment. FIG. 12 is a perspective view of the peeling jig illustrated in FIG. 11 when viewed at a different angle.

As illustrated in FIGS. 11 and 12, the peeling jig 110 includes a cloth clamping member 111 that clamps the outer peripheral edge of the cloth, a handle 112 that pulls the cloth clamping member 111, and a pair of extension bars 113a, 113b that connect the cloth clamping member 111 and the handle 112 to each other. Hereinafter, respective parts will be described.

Figure 13:
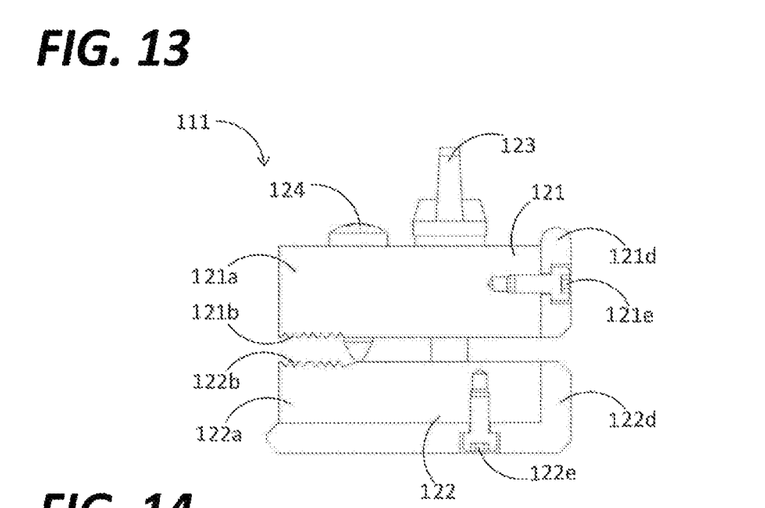
FIG. 13 is a vertical-sectional view illustrating a cloth clamping member of the peeling jig illustrated in FIG. 11.
Figure 14:
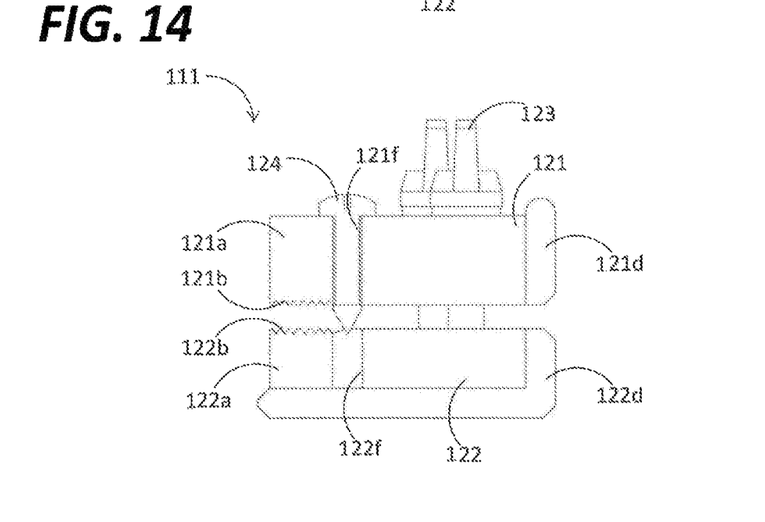
FIG. 14 is a vertical-sectional view illustrating the cloth clamping member illustrated in FIG. 13 at a different position.

FIG. 13 is a vertical-sectional view of the cloth clamping member 111. FIG. 14 is a vertical-sectional view of the cloth clamping member illustrated in FIG. 13 at a different position.

As illustrated in FIGS. 11 to 14, the cloth clamping member 111 includes an upper member 121 and a lower member 122, three fixing screws 123 that fix the upper member 121 and the lower member 122, and two pins 124 that break through the cloth 155 clamped between the upper member 121 and the lower member 122.

Among them, the upper member 121 is made of a metal and has an elongated flat plate shape, and through-holes through which the fixing screws 123 are inserted are formed in the center and in the vicinity of both ends, respectively, in the longitudinal direction. In the illustrated example, the fixing screws 123 are formed in a so-called thumb screw type such that their heads are pivotable directly with fingers.

As illustrated in FIGS. 11 to 14, a clamping portion 121a protruding in a tongue piece shape is provided at the center of one side of the upper member 121. On the lower surface of the clamping portion 121a, teeth 121b formed of a large number of parallel peaks and valleys are formed. Further, the clamping portion 121a of the upper member 121 is provided with screwing holes 121f into which the pins 124 breaking through (or pressing) the cloth 155 are screwed when the outer peripheral edge of the cloth 155 is clamped.

Further, a vertically penetrating confirmation hole 125 is formed at the center of the upper surface of the clamping portion 121a.

Meanwhile, the lower member 122 is made of a metal and has an elongated flat plate shape, and screwing holes are formed in the center and in the vicinity of both ends, respectively, in the longitudinal direction to be screwed with the fixing screws 123.

Further, a clamping portion 122a protruding in a tongue piece shape is provided at the center of one side of the lower member 122. On the upper surface of the clamping portion 122a, teeth 122b formed of a large number of parallel peaks and valleys are formed. The teeth 122b of the upper member 121 and the teeth 122b of the lower member 122 are engageable with each other. In addition, pin insertion holes 122f into which the pins 124 for breaking through the cloth 155 are inserted are formed in the clamping portion 122a of the lower member 122.

A longitudinal length L of the portion where the teeth 121b, 122b of the upper member 121 and the lower member 122 are provided (that is, the clamping portions 121a, 122a) is 5 cm or more, preferably 10 cm or more, and more preferably 20 cm or more. As the length L of the clamping portions 121a, 122a in the longitudinal direction increases, the cloth 155 may be more firmly clamped between the upper member 121 and the lower member 122. However, it is necessary to design the length L in the longitudinal direction of the clamping portions 121a, 122a to be shorter than the length of the handle 112 (to be described later). When it is assumed that the handle 112 is grasped with both hands, the length of the handle 112 is about 30 cm. Therefore, the longitudinal length L of the clamping portions 121a, 122a is practically 30 cm or less. Further, in comparison with the size of the cloth 155, the longitudinal length L of the clamping portions 121a, 122a may be 1/15 or more, and 1/2.5 or less of the diameter of the cloth 155 in the inventors' experience.

In the exemplary embodiment, the rear surface of the upper member 121 and the rear surface and the bottom surface of the lower member 122 when viewed from the clamping portions 121a, 121b are respectively covered with covers 121d, 122d made of a soft member. The material of the covers 121d and 121d may be, for example, resin, rubber, or soft foam.

The cover 121d of the upper member 121 is attached to the rear surface of the upper member 121 by a cover attaching screw 121e, and the cover 122d of the lower member 122 is attached by a cover attaching screw 122e to the rear surface and the bottom surface of the lower member 122. With such a configuration, when the covers 121d, 122e are damaged or contaminated, the covers 121d, 122e may be easily replaced simply by loosening the cover attaching screws 121e, 122e.

In the exemplary embodiment, the handle 112 is a handle assumed to be grasped with both hands, and the longitudinal length of the handle 112 is, for example, 20 cm to 30 cm.

As illustrated in FIGS. 11 and 12, the upper member 121 of the cloth clamping member 111 and the handle 112 are connected by a pair of extension bars 113a, 113b. One end of the extension bar 113a on one side is rotatably attached to a support column 131a provided at one end in the longitudinal direction of the upper member 121, and the other end is rotatably attached to a support column 132a provided at one end in the longitudinal direction of the handle 112. Further, one end of the extension bar 113b on the other side is rotatably attached to a support column 131b provided at one end in the longitudinal direction of the upper member 121, and the other end is rotatably attached to a support column 132b provided at one end in the longitudinal direction of the handle 112.

Next, descriptions will be made on a method of using the peeling jig 110 having such a configuration.

Figure 15:
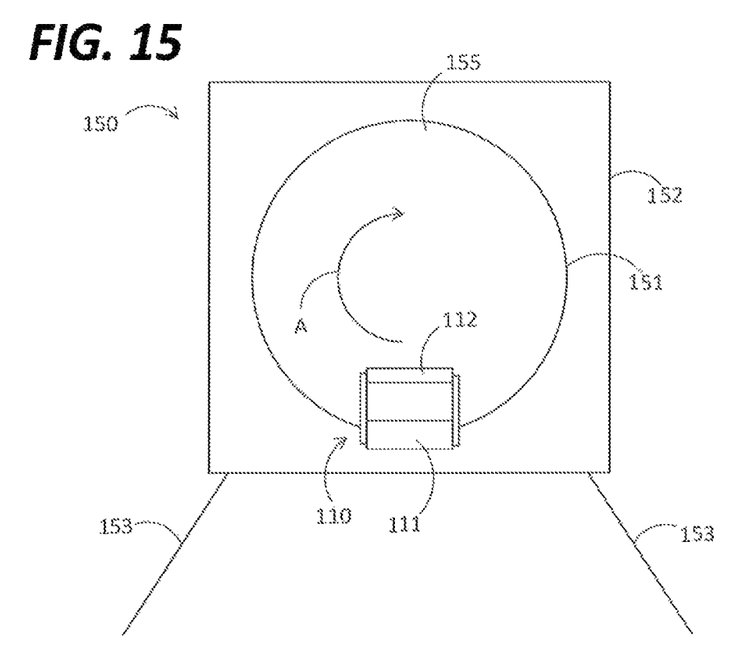
FIG. 15 is a schematic view for explaining a method of using the peeling jig illustrated in FIG. 11.

First, as illustrated in FIG. 15, a door 153 of a polishing room 152 of a polishing apparatus 150 is opened, and a part of the outer peripheral edge of a disk-shaped cloth 155 attached to the upper surface of a turntable 151 is slightly peeled off. Then, the peeled portion of the cloth 155 is clamped between the teeth 121b of the upper member 121 of the cloth clamping member 111 and the teeth 122b of the lower member 122 (see, e.g., FIGS. 13 and 14).

Next, the fixing screws 123 are inserted into through-holes (not illustrated) of the upper member 121 and screwed into screw holes (not illustrated) of the lower member 122, so that the cloth 155 is firmly clamped between the teeth 121b of the upper member 121 and the teeth 122b of the lower member 122. At this time, both the clamping portion 121a of the upper member 121 and the clamping portion 122a of the lower member 122 protrude from the attaching positions of the fixing screws 123, 24 toward the cloth 155. Therefore, even when the length of the cloth clamping member 111 becomes short, there is no case in which the cloth 155 abuts on the fixing screws 123 to cause the cloth 155 so as not be sufficiently inserted between the clamping portion 121a of the upper member 121 and the clamping portion 122a of the lower member 122. Thus, the clamping may be securely performed.

Further, as illustrated in FIGS. 11 and 12, since the clamped cloth 155 is able to be seen from a confirmation hole 125 formed in the upper member 121, it is possible to immediately determine to what extent the cloth 155 is inserted in the cloth clamping member 111.

Next, the pins 124 are inserted through the screwing holes 121f of the upper member 121, break through the cloth 155 clamped between the clamping portions 122a, 122b, and are inserted into the pin insertion holes 122f of the lower member 122. As a result, the cloth 155 is further firmly clamped between the clamping portion 121a of the upper member 121 and the clamping portion 122a of the lower member 122.

As described above, the operation in which the outer peripheral edge of the cloth 155 is fixed to the cloth clamping member 111, may be performed on the cloth on the front side of an operator as illustrated in FIG. 15. Alternatively, the operation may be performed on a cloth on the other side of the operator (although illustration is omitted). As illustrated in FIG. 15, the workability is better when the operation is performed on the cloth on the front side of the operator.

Figure 16:
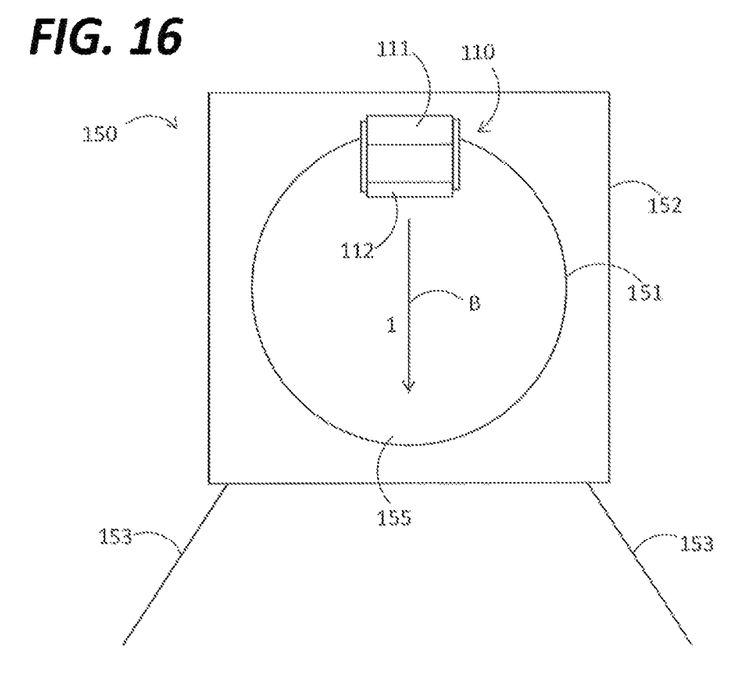
FIG. 16 is a schematic view for explaining a method of using the peeling jig illustrated in FIG. 11.

Next, the turntable 151 is rotated in the direction of the arrow A in FIG. 15, and the peeling jig 110 is arranged on the far side of the operator (see, e.g., FIG. 16). Then, the handle 112 of the peeling jig 110 is grasped with both hands and pulled in the near side (the direction of the arrow B in FIG. 16) so that the cloth 155 is continuously peeled off from the turn table 151.

As described above, however, in the conventional peeling jig using the ratchet handle, since the ratchet handle is directly engaged with one end portion of the winding cylinder at least at the start of winding the cloth, the ratchet handle may interfere with the peripheral devices when the ratchet handle is swung. Therefore, in the conventional peeling jig, when the cloth is peeled off until the time just before the ratchet handle interferes with the peripheral devices, the turntable is rotated to a position where the ratchet handle does not interfere with the peripheral devices, and the turntable cloth is peeled off until the time just before the ratchet handle interferes with the peripheral devices. This work needs to be repeated many times. Further, since complicated ratchet structure is adopted, it is difficult to reduce a manufacturing cost.

Further, instead of using the conventional peeling jig using the ratchet handle, when a worker grasps the outer edge of the cloth with pincers or pliers to pull it, since the worker pulls the outer edge of the cloth while grasping the handle of the pincers or pliers, it is difficult for the worker to apply a force and grasp the cloth securely, which may make the work unsafe.

Meanwhile, according to the exemplary embodiment, when the cloth 155 is clamped between the teeth 121b of the upper member 121 and the teeth 122b of the lower member 122, which are formed in a length of 5 cm or more, the cloth 155 is firmly fixed to the cloth clamping member 111. Therefore, when the handle 112 is grasped and pulled, the cloth 155 may be suppressed from falling out from the cloth clamping member 111, and the cloth 155 may be easily and securely peeled off from the turntable 151. Further, the exemplary embodiment does not adopt a complicated structure such as a ratchet structure but a simple structure. Therefore, the manufacturing cost may be greatly reduced compared with the conventional peeling jig.

According to the exemplary embodiment, the pins 124 of the cloth clamping member 111 break through the cloth 155 so that the cloth 155 may be further firmly fixed to the cloth clamping member 111. Therefore, when the handle 112 is grasped and pulled, the cloth 155 may be further securely suppressed from falling out from the cloth clamping member 111.

Further, according to the exemplary embodiment, since the rear surface of the upper member 121 and the rear surface and the bottom surface of the lower member 122 when viewed from the clamping portions 121a, 121b are covered with the covers 121d and 122d made of soft members, the impact may be absorbed by the covers 121d, 122d even when the cloth clamping member 111 is inadvertently brought into contact with the upper surface of the turntable 151. Therefore, damage to the turntable 151 may be reduced.

Further, according to the exemplary embodiment, the cloth clamping member 111 and the handle 112 are connected by the extension bars 113a, 113b, of which one ends are rotatably attached to the longitudinal end portion of the cross clamping member 111, and the other ends are rotatably attached to the longitudinal end portion of the handle 112. Therefore, when the handle 112 is grasped and pulled, both end portions of the extension bars 113a, 113b are rotated according to the direction of the pulling force, which makes it possible to position the handle 112 at a position where the handle 112 is easily held. As a result, a force may be effectively applied to the handle 112. Therefore, the cloth 155 may be more easily peeled off from the turntable 151.

Although the exemplary embodiment of the present disclosure has been described in detail above, the present disclosure is not limited to this exemplary embodiment, and various modifications may be made to this exemplary embodiment. Hereinafter, an exemplary modification will be described with reference to the drawings. In the following description and the drawings used in the following description, the same reference numerals as those used for the corresponding parts in the above-described embodiment are used for parts that may be configured similarly to the above-described embodiment, and overlapping explanation will be omitted.

Figure 17:
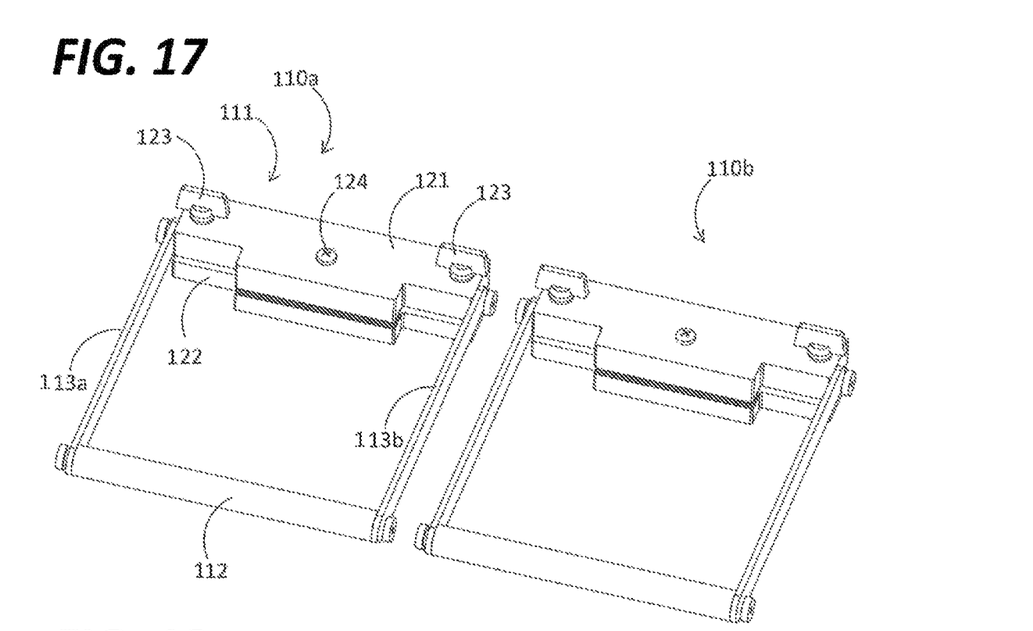
FIG. 17 is a perspective view illustrating peeling jigs according to a modification of the present disclosure.

FIG. 17 is a perspective view illustrating peeling jigs 110a, 110b according to a modification of the present disclosure.

In the example illustrated in FIG. 17, the handle 112 is a handle assumed to be grasped with one hand, and the longitudinal length of the handle 112 is shorter than the length of the handle 112 in the exemplary embodiment illustrated in FIGS. 11 and 12. Accordingly, the number of the fixing screws 123 of the cloth clamping member 111 is reduced by one, and the number of the pins 124 is also reduced by one compared with the exemplary embodiment illustrated in FIGS. 11 and 12.

In the example illustrated in FIG. 17, the cloth 155 may be easily peeled off from the turntable 151 by grasping the respective handles 112 of the two peeling jigs 110a, 110b with the left and right hands and pulling them at the same time. In this case, since each of the peeling jigs 110a, 110b is reduced in size and weight compared with the exemplary embodiment illustrated in FIGS. 11 and 12, damage to the turntable 151 may be relatively reduced even when the peeling jigs 110a, 110b are inadvertently brought into contact with the upper surface of the turntable 151.

Figure 18:
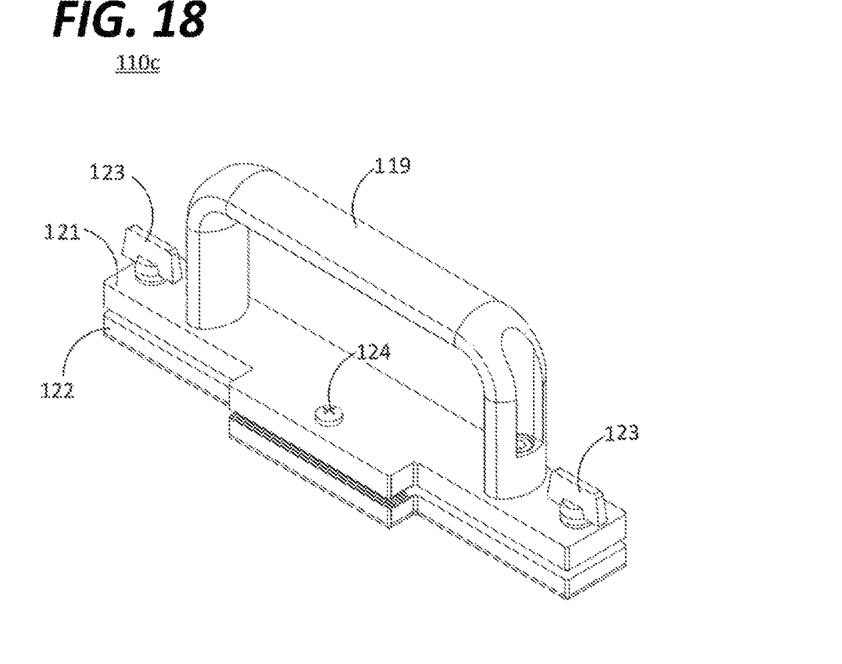
FIG. 18 is a perspective view illustrating a peeling jig according to another modification of the present disclosure.

FIG. 18 is a perspective view illustrating a peeling jig 110c according to another modification of the present disclosure.

In the example illustrated in FIG. 18, a handle 119 has a U-shape and is directly fixed to the upper member 121 of the cloth clamping member 111. In this case, the structure is extremely simple, and the manufacturing cost of the peeling jig 110c may be further reduced.

Further, in each of the above-described exemplary embodiments, the cloth clamping member 111 is made of a metal, but it may be made of a material other than the metal.

Further, in each of the above-described exemplary embodiments, thumb screws are used as the fixing screws 123, but screws having another shape structure may be of course used. Further, those fixing the upper member 121 and the lower member 122 are not necessarily the fixing screws 23, but other fixing means (e.g., bolts and nuts) may be used. Further, when one end of the upper member 121 and the lower member 122 are formed in a hinge structure, one fixing screw 123 may be attached to the opposite side of the hinge structure.

Further, in each of the above-described exemplary embodiments, the peeling jig is used for peeling off the turntable cloth 155, but it may be used for peeling off a vinyl floor material or a wallpaper cloth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A turntable cloth peeling jig comprising:
a cylindrical winding cylinder including a slit formed on an outer periphery of the cylindrical winding cylinder and extending in an axial direction thereof;
a cloth clamping member disposed inside the winding cylinder and configured to clamp an outer peripheral edge of a cloth inserted into the slit;
an extension bar attached to one end portion of the winding cylinder so as to extend coaxially therewith;
an engaging portion provided at a tip end portion of the extension bar and engaged with a rotating jig extending radially with regard to the extension bar and configured to rotate the winding cylinder; and
a handle extending from an outer portion of the engaging portion, the handle extending radially with regard to the extension bar, and the handle being configured to support the winding cylinder, the handle and the outer portion of the engaging portion being configured to remain stationary when rotating the rotating jig relative to the handle to rotate the winding cylinder.

2. The turntable cloth peeling jig of claim 1, wherein the engaging portion is a gear wrench that reduces a rotational torque of the rotating jig.

3. The turntable cloth peeling jig of claim 1, wherein the cloth clamping member includes an upper member and a lower member that clamp the outer peripheral edge of the cloth from an upper side and a lower side thereof, and
the upper and lower members include mutually engageable teeth provided on mutually facing surfaces thereof.

4. The turntable cloth peeling jig of claim 1, wherein the cloth clamping member includes an upper member and a lower member that clamp the outer peripheral edge of the cloth from an upper side and a lower side thereof, and
one of the upper and lower members includes a pin configured to break through the cloth when the outer peripheral edge of the cloth is clamped, and a remaining one of the upper and lower members includes a pin insertion hole into which the pin is inserted.

5. The turntable cloth peeling jig of claim 1, wherein an axial length of the extension bar is longer than an axial length of the winding cylinder.

6. The turntable cloth peeling jig of claim 1, wherein the engaging portion is a wrench.

7. A turntable cloth peeling jig comprising:
a cloth clamping member configured to clamp an outer peripheral edge of a cloth;
a handle configured to pull the cloth clamping member; and
an extension bar configured to connect the cloth clamping member and the handle,
wherein the cloth clamping member includes an upper member and a lower member that clamp the outer peripheral edge of the cloth from an upper side and a lower side thereof,
the upper and lower members include mutually engageable teeth provided on mutually facing surfaces thereof,
the teeth are provided over 5 cm or more in a longitudinal direction of the upper and lower members, and
one end of the extension bar is rotatably attached to a longitudinal end portion of the cloth clamping member, and another end of the extension bar is rotatably attached to a longitudinal end portion of the handle.

8. The turntable cloth peeling jig of claim 7, wherein one of the upper and lower members includes a pin for breaking through the cloth when the outer peripheral edge of the cloth is clamped, and a remaining one the upper and lower members includes a pin insertion hole into which the pin is inserted.

9. The turntable cloth peeling jig of claim 7, wherein at least a part of each of the upper member and the lower member is covered with a cover made of a soft member.

10. The turntable cloth peeling jig of claim 7, wherein the handle has a U-shape and is directly fixed to the cloth clamping member.

* * * * *